US010565704B2

(12) United States Patent
Inoue

(10) Patent No.: US 10,565,704 B2
(45) Date of Patent: Feb. 18, 2020

(54) INSPECTION METHOD AND INSPECTION SYSTEM

(71) Applicant: NUFLARE TECHNOLOGY, INC., Yokohama-shi (JP)

(72) Inventor: Takafumi Inoue, Chigasaki (JP)

(73) Assignee: NuFlare Technology, Inc., Yokohama-shi (JP)

( * ) Notice: Subject to any disclaimer, the term of this patent is extended or adjusted under 35 U.S.C. 154(b) by 73 days.

(21) Appl. No.: 16/000,110

(22) Filed: Jun. 5, 2018

(65) Prior Publication Data

US 2018/0350057 A1 Dec. 6, 2018

(30) Foreign Application Priority Data

Jun. 6, 2017 (JP) .................................. 2017-111983

(51) Int. Cl.
*G06K 9/00* (2006.01)
*G06T 7/00* (2017.01)

(52) U.S. Cl.
CPC .... *G06T 7/001* (2013.01); *G06T 2207/10004* (2013.01); *G06T 2207/30148* (2013.01)

(58) Field of Classification Search
CPC .................. G06T 7/001; G06T 7/0004; G06T 2207/30152; G06T 2207/10004;
(Continued)

(56) References Cited

U.S. PATENT DOCUMENTS

| 6,603,877 B1 * | 8/2003 | Bishop ............. G01N 21/95607 |
| | | 382/100 |
| 8,213,703 B2 * | 7/2012 | Inoue ...................... G06T 7/001 |
| | | 382/144 |

(Continued)

FOREIGN PATENT DOCUMENTS

| JP | 60-245222 | 12/1985 |
| JP | 7-63698 | 3/1995 |

(Continued)

OTHER PUBLICATIONS

Taiwanese Office Action and Search Report dated Feb. 21, 2019 in Patent Application No. 107116878, 11 pages (with unedited computer generated English translation of the Office Action and English Translation of Category of Cited Documents).

*Primary Examiner* — Amir Alavi
(74) *Attorney, Agent, or Firm* — Oblon, McClelland, Maier & Neustadt, L.L.P.

(57) ABSTRACT

An inspection region 201 of a sample 2 is scanned with light, an optical image formed of the scanning light is acquired according to progression of scanning with the light, a reference image as a reference for the acquired optical image is created according to progression of acquisition of the optical image, the acquired optical image is compared to the reference image for the optical image to detect first defects in the pattern according to progression of the acquisition of the optical image, second defects caused by an erroneous operation of an inspection system 1 are detected based on a distribution of differences between the acquired optical image and the reference image during progression of detection of the first defects, and an inspection is stopped when the second defects are detected.

7 Claims, 11 Drawing Sheets

(58) Field of Classification Search
CPC ........ G06T 2207/30148; G06K 9/6407; G06K 9/2009; G06K 9/6423; G06F 17/30249; G01N 21/9501; G01N 21/95607
See application file for complete search history.

(56) References Cited

U.S. PATENT DOCUMENTS

| | | | | |
|---|---|---|---|---|
| 8,548,223 | B2 * | 10/2013 | Inoue | ...................... G06T 7/001 |
| | | | | 382/145 |
| 8,861,832 | B2 * | 10/2014 | Inoue | ................... G06T 7/0004 |
| | | | | 257/E21.023 |
| 9,202,270 | B2 * | 12/2015 | Inoue | ...................... G06T 7/001 |
| 9,235,883 | B2 * | 1/2016 | Inoue | ................... G06T 7/0004 |
| 9,710,905 | B2 * | 7/2017 | Inoue | ...................... G06T 7/001 |
| 9,922,415 | B2 * | 3/2018 | Inoue | ...................... G06T 7/001 |
| 10,281,415 | B2 * | 5/2019 | Inoue | ...................... H01J 37/28 |
| 2007/0038325 | A1 * | 2/2007 | Guldi | ................... G03F 7/7065 |
| | | | | 700/110 |
| 2016/0292839 | A1 | 10/2016 | Inoue et al. | |
| 2018/0350057 | A1 * | 12/2018 | Inoue | ....................... G03F 1/84 |

FOREIGN PATENT DOCUMENTS

| | | |
|---|---|---|
| JP | 10-325713 | 12/1998 |
| JP | 2004-177139 | 6/2004 |
| JP | 2012-173072 | 9/2012 |
| JP | 2016-70741 | 5/2016 |
| JP | 2016-194482 | 11/2016 |

* cited by examiner

DEFECT REACTION VALUE : 0~255

| 0 | 0 | 0 | 0 | 0 | 0 | 0 | 0 | 0 | 0 |
|---|---|---|---|---|---|---|---|---|---|
| 0 | 0 | 0 | 0 | 0 | 0 | 0 | 0 | 0 | 0 |
| 10 | 30 | 10 | 10 | 30 | 10 | 10 | 30 | 10 | 0 |
| 30 | 255 | 30 | 30 | 255 | 30 | 30 | 255 | 30 | 0 |
| 10 | 30 | 10 | 10 | 30 | 10 | 10 | 30 | 10 | 0 |
| 0 | 0 | 0 | 0 | 0 | 0 | 0 | 0 | 0 | 0 |
| 0 | 0 | 0 | 0 | 0 | 0 | 0 | 0 | 0 | 0 | p

FIG.17

INSPECTION METHOD AND INSPECTION SYSTEM

CROSS-REFERENCE TO RELATED APPLICATIONS

This application is based upon and claims the benefit of priority from Japanese Patent Application No. 2017-111983, filed on Jun. 6, 2017, the entire contents of which are incorporated herein by reference.

FIELD

The embodiments of the present invention relate to an inspection method and an inspection system.

BACKGROUND

In a conventional inspection, defects in a pattern formed on a mask to be used for photolithography can be identified only after transferred onto a wafer. In recent years, in order to enable defects in a pattern to be detected in advance, a defect-transferability consideration inspection considering a transfer condition of defects onto a wafer has been adopted in an inspection on defects in a pattern.

In the defect-transferability consideration inspection, a first inspection is first performed to compare an optical image obtained by imaging a mask to a reference image generated based on design data of the mask and detect a portion in which a difference between the optical image and the reference image is equal to or larger than a predetermined threshold for defect determination as a defect. In order to increase the defect detection accuracy, the threshold is set to a low value in the first inspection to purposely detect an excessive number of defects. Following the first inspection, in the defect-transferability consideration inspection, a second inspection is performed to detect true defects from the defects detected in the first inspection in accordance with a predetermined algorithm considering a transfer condition of defects onto a wafer.

In the first inspection, a large quantity of defects as many as a million defects are sometimes detected on the entire face of a mask. Many true defects may be included in the defects detected in the first inspection. However, in a D-DB (Die to Database) inspection, when a reference image is generated based on design data of a mask, an abnormality may occur in the reference image due to an error of an inspection system, such as garbled references, in a process of generating the reference image. Due to occurrence of an abnormality in the reference image, many defects caused by the abnormality in the reference image may occur in the defects detected in the first inspection. Furthermore, as the defects caused by an error of the inspection system, many defects due to misalignment of the mask, light amount variation of a light source for detecting an optical image of the mask, and the like may occur, in addition to the defects due to the abnormality in the reference image. Because these defects caused by an error of the inspection system, that is, pseudo defects are not true defects, it is required to prevent these defects from being erroneously detected as defects.

In inspections before using the defect-transferability consideration inspection, a relatively small number of defects, such as several to several tens of defects are detected on the entire face of a mask. Therefore, defects caused by an error of an inspection system can be detected based on a fact that an excessive number of defects are generated and then an error stop of the inspection can be performed.

SUMMARY

However, the defect-transferability consideration inspection has a following problem. An excessive number of defects as many as a million defects are sometimes detected in the first inspection. Therefore, even when defects caused by an error of the inspection system are included in the detected defects, it is difficult to detect the defects caused by the error in the first inspection only based on the number of generated defects and perform an error stop of the first inspection. Accordingly, in the defect-transferability consideration inspection, after the first inspection on the entire face of the mask is completed, an operation to check whether the defects detected in the first inspection are true defects or defects caused by an error of the inspection system is needed.

Therefore, there is conventionally a problem that it is difficult to quickly detect defects caused by an error of an inspection system in an inspection accompanied by detection of many defects and to stop the inspection.

An object of the present invention is to provide an inspection method and an inspection system that can quickly detect defects caused by an error of an inspection system in an inspection accompanied by detection of many defects and can stop the inspection.

An inspection method according to an aspect of the present invention is an inspection method for inspecting defects in a pattern located on a sample using an inspection system inspecting the defects in the pattern, the inspection method comprising: scanning an inspection region of the sample with light; acquiring an optical image formed of the scanning light according to progression of scanning with the light; creating a reference image as a reference for the acquired optical image according to progression of acquisition of the optical image; comparing the acquired optical image to the reference image for the optical image to detect first defects in the pattern according to progression of the acquisition of the optical image; detecting second defects in the pattern caused by an erroneous operation of the inspection system based on a distribution of differences between the acquired optical image and the reference image during progression of detection of the first defect; and stopping the inspection when the second defects are detected.

In the inspection method described above, the detection of the second defects can comprise: comparing a difference between the optical image and the reference image to a first threshold being a threshold for the difference in each unit of one frame or plural consecutive frames in the optical image; and when the units of one frame or plural frames in which the difference is equal to or larger than the first threshold are distributed consecutively by a consecution number equal to or larger than a second threshold being a threshold for a consecution number of the units of one frame or plural frames, detecting the units of one frame or plural frames distributed consecutively as the second defects.

In the inspection method described above, the difference between the optical image and the reference image is at least either a sum of gradation value differences or a sum of position displacement amounts between the optical image and the reference image in respective pixels, and the detection of the second defects can comprise, when units of one frame or plural frames in which the sum of at least either the gradation value differences or the position displacement amounts between the optical image and the reference image is equal to or larger than the first threshold are distributed consecutively by a consecution number equal to or larger than the second threshold, detecting the units of one frame or plural frames distributed consecutively as the second defects.

In the inspection method described above, the detection of the second defects can comprise: when pixels or frames in which white and black are inverted between the optical image and the reference image or pixels or frames in which a reaction value for defect determination corresponding to a difference between the optical image and the reference image has a maximum value are distributed consecutively in the optical image by a consecution number equal to or larger than a third threshold being a threshold for a consecution number of the pixels or frames, detecting the pixels or frames distributed consecutively as the second defects, and/or when pixels or frames in which white and black are inverted between the optical image and the reference image or pixels or frames in which the reaction value has a maximum value are distributed periodically or discretely in the optical image with a skip number between pixels or frames equal to or smaller than a fourth threshold being a threshold for a skip number between the pixels and frames, detecting the pixels or frames distributed periodically or discretely as the second defects.

An inspection system according to an aspect of the present invention is an inspection system inspecting defects in a pattern located on a sample, the inspection system comprising: a light scanner scanning an inspection region of the sample with light; an optical-image acquiring part acquiring an optical image formed of the scanning light according to progression of scanning by the light scanner; a reference image creator creating a reference image as a reference for the acquired optical image according to progression of acquisition of the optical image by the optical-image acquiring part; a first detector detecting first defects in the pattern by comparing the acquired optical image to the reference image created for the optical image by the reference image creator according to progression of the acquisition of the optical image by the optical-image acquiring part; a second detector detecting second defects in the pattern caused by an erroneous operation of the inspection system based on a distribution of differences between the acquired optical image and the reference image during progression of detection of the first defects; and an inspection stopper stopping the inspection when the second defects are detected.

According to the present invention, in an inspection accompanied by detection of many defects, it is possible to quickly detect defects caused by an error of an inspection system and to stop the inspection.

BRIEF DESCRIPTION OF THE DRAWINGS

FIG. 17 is a plan view illustrating another example of the defect reaction values in the pattern inspection method according to the fourth embodiment.

DETAILED DESCRIPTION

Figure 1:
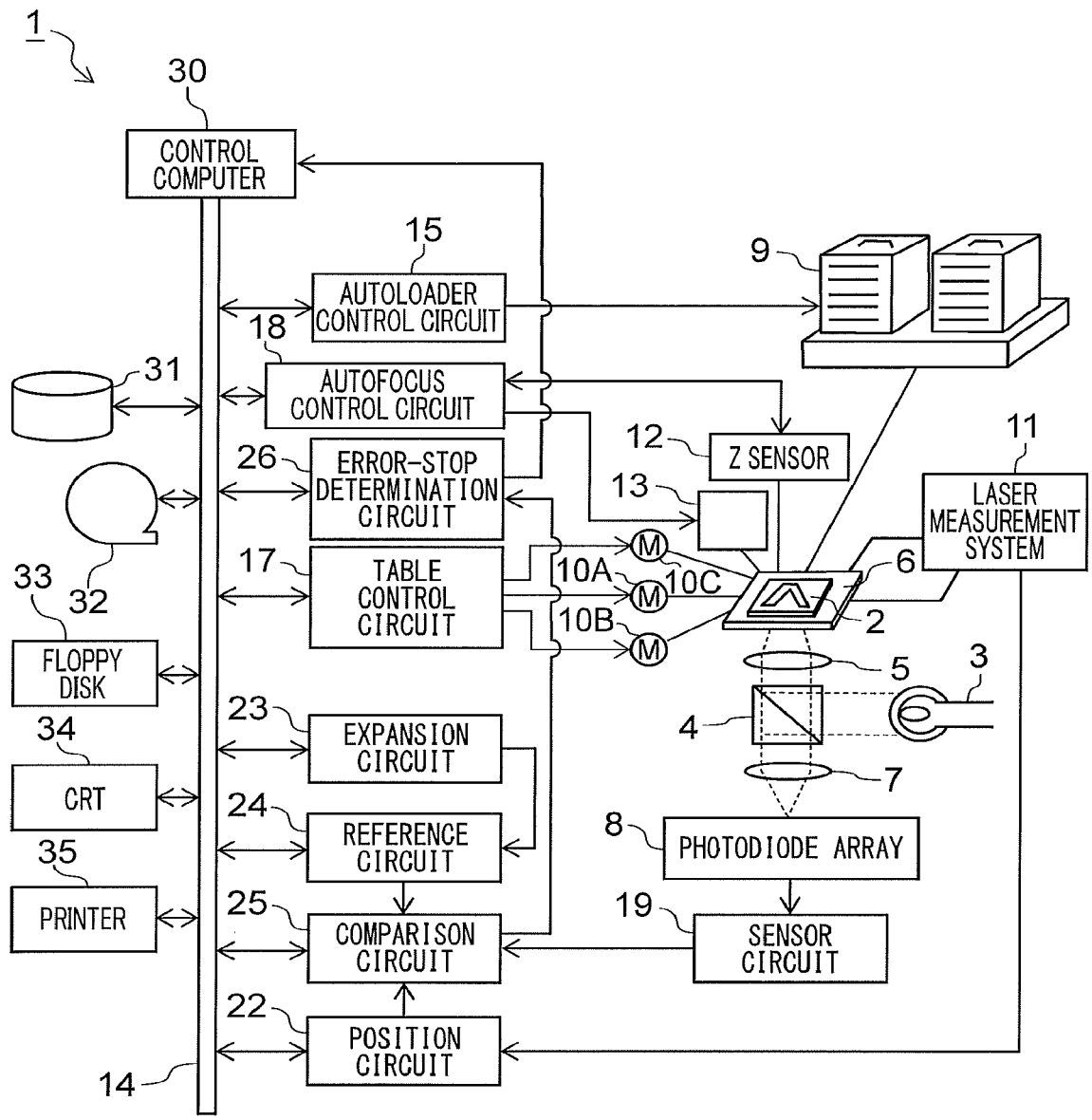
FIG. 1 is a diagram illustrating a pattern inspection system 1 according to a first embodiment.

Embodiments of the present invention will now be explained with reference to the accompanying drawings. The present invention is not limited to the embodiments. In the drawings referred to in the following embodiments, like elements or elements having mutually identical functions are denoted by like or similar reference characters, and redundant explanations thereof will be omitted.

First Embodiment

FIG. 1 is a diagram illustrating a pattern inspection system 1 according to a first embodiment as an example of an inspection system. The pattern inspection system 1 illustrated in FIG. 1 can be used, for example, to inspect defects in a pattern formed on a mask 2 being an example of a sample by a D-DB inspection.

As illustrated in FIG. 1, the pattern inspection system 1 includes a light source 3, a polarizing beam splitter 4, an illuminating optical system 5, an XYθ table 6, an enlarging optical system 7, and a photodiode array 8 being an example of an optical-image acquiring part in this order in a light travel direction. A waveplate that changes the polarization direction of light can be provided between the polarizing beam splitter 4 and the XYθ table 6.

The light source 3 emits laser light toward the polarizing beam splitter 4. The polarizing beam splitter 4 reflects the light from the light source 3 toward the illuminating optical system 5. The illuminating optical system 5 irradiates the XYθ table 6 with the light reflected by the polarizing beam splitter 4. The mask 2 placed on the XYθ table 6 reflects the light irradiated by the illuminating optical system 5. The mask 2 is illuminated with the reflection light of the mask 2. The reflection light of the mask 2 transmits through the illuminating optical system 5 and the polarizing beam splitter 4 and then enters the enlarging optical system 7. The enlarging optical system 7 causes the incident reflection light of the mask 2 to form an image as an optical image of the mask 2 on the photodiode array 8. The photodiode array 8 photoelectrically converts the optical image of the mask 2. Defects in the pattern formed on the mask 2 are inspected based on the photoelectrically-converted optical image of the mask 2.

As illustrated in FIG. 1, the pattern inspection system 1 also includes an autoloader 9, an X-axis motor 10A, a Y-axis motor 10B, a θ-axis motor 10C, a laser measurement system 11, a Z sensor 12, and a focus mechanism 13.

The autoloader 9 automatically transports the mask 2 on the XYθ table 6. The X-axis motor 10A, the Y-axis motor 10B, and the θ-axis motor 10C move the XYθ table 6 in an X direction, a Y direction, and a θ direction, respectively. By moving the XYθ table 6, the mask 2 on the XYθ table 6 is scanned with the light from the light source 3. The laser measurement system 11 detects positions of the XYθ table 6 in the X direction and the Y direction.

The Z sensor 12 detects the height of a mask face being a surface of the mask 2 on a pattern side, that is, the position in the Z direction. The Z sensor 12 can include, for example, a projector that applies light to the mask face, and a photoreceiver that receives the applied light.

The focus mechanism 13 performs focusing to bring the illuminating optical system 5 into focus on the mask face. The focusing is achieved, for example, by moving the XYθ table 6 in the Z direction by a movement amount corresponding to the height of the mask face detected by the Z sensor 12.

As illustrated in FIG. 1, the pattern inspection system 1 further includes various circuits connected to a bus 14. Specifically, the pattern inspection system 1 includes an autoloader control circuit 15, a table control circuit 17 being an example of a light scanner, and an autofocus control circuit 18. The pattern inspection system 1 also includes a position circuit 22, an expansion circuit 23, a reference circuit 24 being an example of a reference image creator, a comparison circuit 25 being an example of a first detector and a second detector, and an error-stop determination circuit 26 being an example of an inspection stopper. The pattern inspection system 1 also includes a sensor circuit 19 and the sensor circuit 19 is connected between the photodiode array 8 and the comparison circuit 25.

The autoloader control circuit 15 controls the autoloader 9 to automatically transport the mask 2 onto the XYθ table 6.

The table control circuit 17 executes control to scan an inspection region 201 (see FIG. 3) of the mask 2 where defects in a pattern are to be inspected with the light from the light source 3 along stripes 202 obtained by virtually dividing the inspection region 201 into a plurality of reed shapes. Specifically, the table control circuit 17 drivingly controls the motors 10A to 10C to move the XYθ table 6 in such a manner that the inspection region 201 is scanned with the light from the light source 3 along the stripes 202. According to progression of the scanning with the light along the stripes 202, acquisition of an optical image of the mask 2 by the photodiode array 8 with respect to each of the stripes 202 is progressed. A optical image of the mask 2 with respect to each of the stripes 202 is constituted of frames each being a pixel aggregation including a predetermined number of pixels (512 pixels, for example) in the X direction corresponding to the extension direction of the stripes 202, that is, the progression direction of the scanning by a predetermined number of pixels (512 pixels, for example) in the Y direction corresponding to the width direction of the stripes 202.

The autofocus control circuit 18 controls the focus mechanism 13 according to the height of the mask face detected by the Z sensor 12 to automatically focus the light from the light source 3 on the mask face.

The sensor circuit 19 captures the optical image photoelectrically converted by the photodiode array 8 and A/D-converts the captured optical image. The sensor circuit 19 outputs the A/D-converted optical image to the reference circuit 24 and the comparison circuit 25. The sensor circuit 19 can be, for example, a circuit of a TDI (Time Delay Integration) sensor. With use of the TDI sensor, the pattern can be imaged with high accuracy. The laser measurement system 11 detects a movement position of the XYθ table 6 and outputs the detected movement position to the position circuit 22. The position circuit 22 detects the position of the mask 2 on the XYθ table 6 based on the movement position input from the laser measurement system 11. The position circuit 22 outputs the detected position of the mask 2 to the comparison circuit 25.

The expansion circuit 23 reads design data collected into a magnetic disk device 31, which will be explained later, from the magnetic disk device 31, and converts the read design data into binary or multi-valued image data. The expansion circuit 23 outputs the converted image data to the reference circuit 24.

The reference circuit 24 performs appropriate filtering to the image data input from the expansion circuit 23 to generate a reference image to be used for a defect inspection on the mask 2. That is, the reference circuit 24 outputs the generated reference image to the comparison circuit 25.

The comparison circuit 25 inspects defects in a pattern formed on the mask 2 based on a comparison between the optical image of the mask 2 input from the sensor circuit 19 and the reference image input from the reference circuit 24.

Specifically, the comparison circuit 25 performs a defect-transferability consideration inspection by a first inspection of excessively detecting defects while setting a threshold for determining whether there are defects to a low value, and a second inspection of detecting true defects from the defects detected in the first inspection.

In the first inspection, the table control circuit 17 moves the XYθ table 6 by driving control of the motors 10A to 10C to scan the inspection region 201 on the mask 2 with the light from the light source 3 along the stripes 202. The photodiode array 8 acquires an optical image of each of the stripes 202, which is formed of the scanning light reflected from the mask 2 according to progression of the scanning with the light along the stripes 202.

The reference circuit 24 generates a reference image based on the design data of the mask 2 according to progression of the acquisition of the optical image.

The comparison circuit 25 detects first defects in a pattern by comparing the acquired optical image to the reference image for a reference to the optical image according to the progression of the acquisition of the optical image. In order to increase the defect detection accuracy in the detection of first defects, the comparison circuit 25 uses a low threshold that is lowered so as to enable a large quantity of, for example, about a million first defects to be detected, as a threshold for determining whether there are first defects. This threshold can be a lower value than a threshold used to detect true defects from the first defects in the second inspection, which will be described later. The comparison circuit 25 can compare a line width or a gradation value of the pattern between the optical image and the reference image to detect positions in the pattern where a difference in the line width or the gradation value is equal to or larger than a threshold as the first defects.

In the first inspection, the optical image can be formed through the enlarging optical system 7 having a high aperture ratio in order to obtain an optical image appropriately reflecting minute correction portions according to OPC (Optical Proximity Correction) provided on the pattern to match a design pattern and a transfer pattern with each other. In this case, the optical image detected by the photodiode array 8 has a larger difference from the reference image based on the design data because the correction portions on the pattern are reflected. Therefore, the number of the first defects detected by the comparison to the threshold is likely to be larger and the detection accuracy of the first defects is easily ensured.

The comparison circuit 25 detects second defects caused by an erroneous operation, that is, an error of the pattern inspection system 1 based on a distribution of differences between the acquired optical image and the reference image during the progression of the detection of first defects. That is, the comparison circuit 25 detects second defects by determining whether there are second defects using the distribution of differences between the optical image and the reference image as a criterion. The erroneous operation of the pattern inspection system 1 includes, for example, garbled references, misalignment of the mask 2, and variation in the light amount of the light source 3.

In the detection of second defects, the comparison circuit 25 compares the sum of gradation value differences in pixels, being an example of the difference between the optical image and the reference image, to a first threshold being a threshold for the sum of the gradation value differences, with respect to each frame in the optical image of each of the stripes 202. The sum of the gradation value differences in pixels between the optical image and the reference image with respect to each frame is, in other words, a value obtained by adding up differences of gradation values in corresponding pixels between one frame in the optical image and one frame in the reference image corresponding to the frame in the optical image. When frames in which the sum of the gradation value differences is equal to or larger than the first threshold are distributed consecutively by the number of consecutive frames (hereinafter, "consecution number") equal to or larger than a second threshold being a threshold for the consecution number of the frames, the comparison circuit 25 determines the frames distributed consecutively as second defects and detects the determined second defects. Although the determination as to whether there are second defects is hereinafter not particularly referred to, the detection of the second defects assumes that it has been determined that there are second defects in the determination as to whether there are second defects.

If the second defects are detected only based on a fact that the number of generated defects is large, it is difficult to detect the second defects during the first inspection assuming that many defects are detected. In contrast thereto, in the first embodiment, considering locality of the second defects that the second defects caused by an erroneous operation of the pattern inspection system 1 occur locally in a large number, the second defects are detected based on the distribution of differences between the optical image and the reference image. Specifically, consecutively-distributed frames where the sum of gradation value differences is equal to or larger than the first threshold and the consecution number is equal to or larger than the second threshold are detected as the second defects. By performing this detection of second defects adapted to locality of the second defects, the second defects can be detected appropriately and an error stop of the first inspection can be performed even when the number of the first defects detected in the first inspection is large.

The error-stop determination circuit 26 determines whether to perform an error stop of the first inspection based on whether the second defects are detected. When the second defects are detected, the error-stop determination circuit 26 determines to perform an error stop of the first inspection and executes control to perform an error stop of the first inspection. The control to perform an error stop of the first inspection can be, for example, control to stop the comparison between the optical image and the reference image by the comparison circuit 25, control to cause the table control circuit 17 to stop the movement of the XYθ table 6, or control to stop emission of the light from the light source 3.

When the first inspection is completed up to the last stripe without any error stop, the comparison circuit 25 performs the second inspection. In the second inspection, the comparison circuit 25 detects true defects from the first defects detected in the first inspection. The second inspection can be performed, for example, by comparing a difference between the optical image and the reference image, such as a difference in the line width or a gradation value difference, to a threshold. The threshold in the second inspection can be a larger value than the threshold for detecting the first defects. Furthermore, in the second inspection, the optical image can be formed through the enlarging optical system 7 having an aperture ratio reduced by adjustment of a diaphragm or the like in order to suppress the influences of the correction portions on the pattern according to the OPC and obtain an optical image closer to the transfer pattern. In this case, because the correction portions on the pattern according to the OPC are less likely to be reflected, the optical image detected by the photodiode array 8 has a smaller difference from the reference image. Accordingly, defects detected by the comparison to the threshold can be restricted to true defects.

In addition to the configuration described above, the pattern inspection system 1 also includes a control computer 30, the magnetic disk device 31, a magnetic tape device 32, a floppy disk® 33, a CRT (Cathode Ray Tube) 34, and a printer 35 as illustrated in FIG. 1. These constituent elements 30 to 35 are all connected to the bus 14. The control computer 30 executes various types of control or processing related to the defect inspection to the constituent elements connected to the bus 14. The magnetic disk device 31 stores therein the design data of the mask 2. The magnetic tape device 32 and the floppy disk 33 store therein various types of information related to the defect inspection. The CRT 34 displays various images related to the defect inspection. The printer 35 prints various types of information related to the defect inspection.

According to the pattern inspection system 1 of the first embodiment, the second defect are detected during the progression of the detection of the first defects, whereby the second defects resulting from an erroneous operation of the pattern inspection system 1 are quickly detected during the first inspection and an error stop of the first inspection can be promptly performed. Accordingly, it is possible to prevent the first inspection for stripes subsequent to a stripe in which the second defects are detected from being continued uselessly and thus improvement of the inspection efficiency and reduction of the cost can be also achieved.

Pattern Inspection Method

Figure 2:
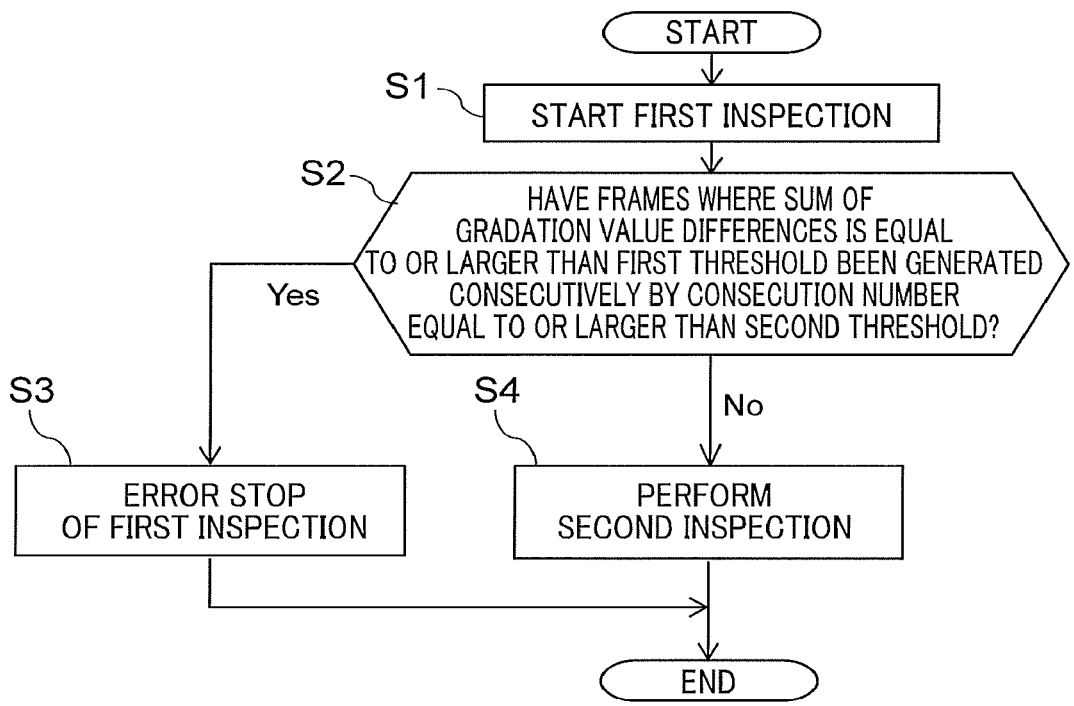
FIG. 2 is a flowchart illustrating the pattern inspection method according to the first embodiment.
Figure 3:
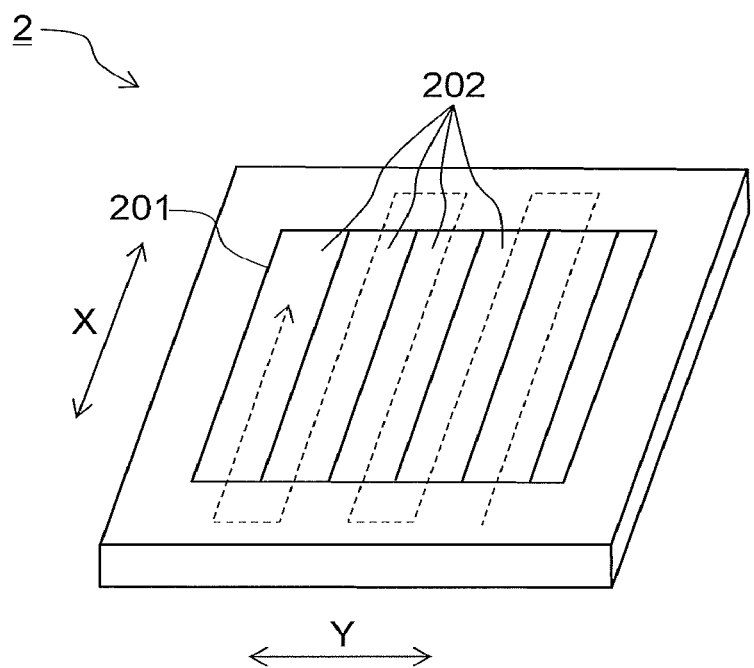
FIG. 3 is a perspective view illustrating the pattern inspection method according to the first embodiment.

A pattern inspection method according to the first embodiment, to which the pattern inspection system 1 illustrated in FIG. 1 is applied, is explained next. FIG. 2 is a flowchart illustrating the pattern inspection method according to the first embodiment. FIG. 3 is a perspective view illustrating the pattern inspection method according to the first embodiment. As illustrated in FIG. 3, the inspection region 201 on the mask 2 is divided virtually into the stripes 202 in a reed shape. The photodiode array 8 takes an image of the mask 2 with respect to each of the stripes 202 with movement of the XYθ table 6. At that time, the table control circuit 17 controls the motion of the XYθ table 6 in such a manner that the stripes 202 are scanned continuously in a direction indicated by a dashed arrow in FIG. 3. While the XYθ table 6 is moved, defects in a pattern on the stripes 202 are inspected based on the optical image taken by the photodiode array 8.

Specifically, the comparison circuit 25 first starts the first inspection of detecting the first defects in the pattern by comparing the optical image to the reference image as illustrated in FIG. 2 (Step S1). In the first inspection, the comparison circuit 25 compares the line width or the gradation value of the pattern between the optical image and the reference image and detects a portion in the pattern where a difference in the line width or the gradation value is equal to or larger than a threshold as a first defect. Because the threshold is purposely set to a low value, many first defects, for example, as many as a million defects can be detected in the first inspection.

After starting the first inspection, the comparison circuit 25 detects second defects in the pattern caused by an erroneous operation of the pattern inspection system 1. In the detection of the second defects, the comparison circuit 25 detects the second defects based on a distribution of differences between the optical image and the reference image considering locality of the second defects.

Specifically, as illustrated in FIG. 2, the comparison circuit 25 determines whether frames in which the sum of the gradation value differences between the optical image and the reference image is equal to or larger than the first threshold have been generated, that is, distributed consecutively by a consecution number equal to or larger than the second threshold (Step S2).

When frames in which the sum of the gradation value differences is equal to or larger than the first threshold have been generated consecutively by a consecution number equal to or larger than the second threshold (YES at Step S2), the comparison circuit 25 detects the generated consecutive frames as the second defects and the error-stop determination circuit 26 performs an error stop of the first inspection in response to the fact that the second defects are detected (Step S3).

Figure 4:
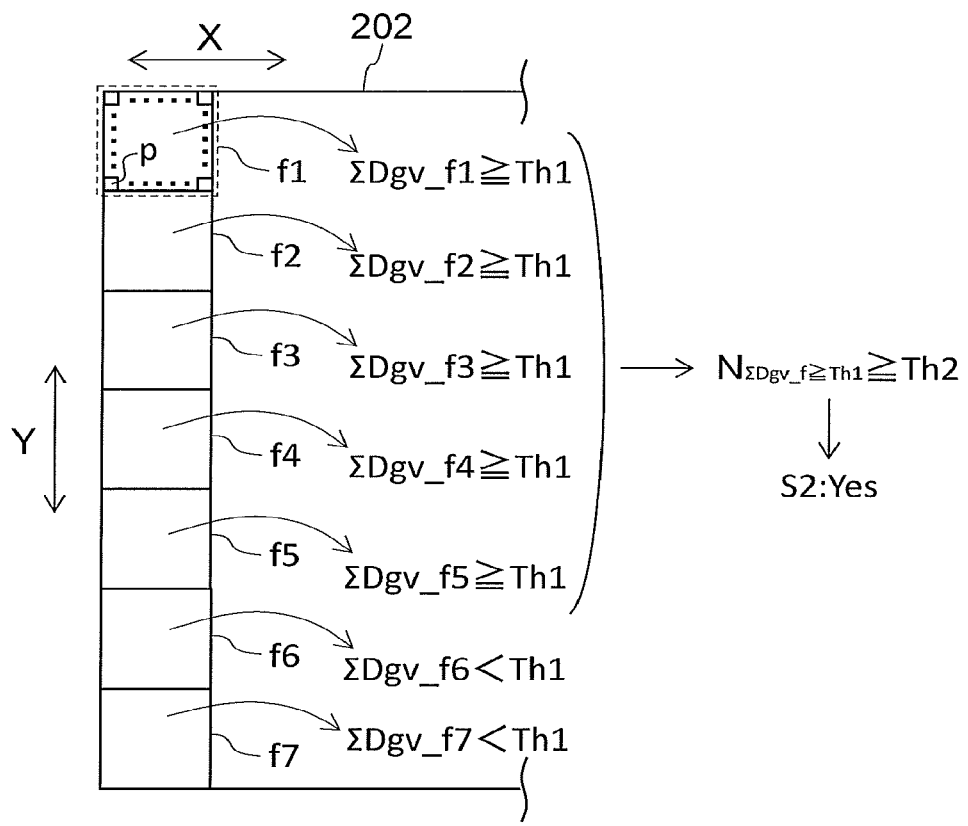
FIG. 4 is an explanatory diagram for explaining a detection process of the second defects in the pattern inspection method according to the first embodiment.

FIG. 4 is an explanatory diagram for explaining a detection process of the second defects in the pattern inspection method according to the first embodiment. First to seventh frames f1 to f7 arrayed in the Y direction corresponding to the width direction of the stripes 202 are illustrated in FIG. 4 as an optical image corresponding to one stripe 202. For easy understanding of a correspondence relation with the stripe 202, the first to seventh frames f1 to f7 are illustrated in FIG. 4 to be superimposed on the stripe 202.

Each of the first to seventh frames f1 to f7 is composed of pixels p, for example, 512 pixels in the X direction by 512 pixels in the Y direction. In the example illustrated in FIG. 4, sums $\Sigma Dgv\_f1$ to $\Sigma Dgv\_f5$ of gradation value differences between the optical image and the reference image of the first to fifth frames f1 to f5 are equal to or larger than a first threshold Th1. On the other hand, sums $\Sigma Dgv\_f6$ and $\Sigma Dgv\_f7$ of gradation value differences between the optical image and the reference image of the sixth and seventh frames f6 and f7 are smaller than the first threshold Th1.

In the example illustrated in FIG. 4, a second threshold Th2 for a consecution number $N_{\Sigma Dgv\_f \geq Th1}$ of frames in which the sum of the gradation value differences is equal to or larger than the first threshold Th1 is set to "4". In this case, because the consecution number $N_{\Sigma Dgv\_f \geq Th1}$ of the first to fifth frames f1 to f5 in which the sum of the gradation value differences is equal to or larger than the first threshold Th1 is "5", the consecution number $N_{\Sigma Dgv\_f \geq Th1}$ is equal to or larger than the second threshold Th2 (YES at Step S2). Therefore, in the example illustrated in FIG. 4, the consecutive first to fifth frames f1 to f5 are detected as the second defects and an error stop of the first inspection is performed. In the example illustrated in FIG. 4, the frames f1 to f5 in which the sum of the gradation value differences is equal to or larger than the first threshold Th1 continue in the Y direction by the number equal to or larger than the second threshold Th2. Other than this case, for example, also in a case where frames in which the sum of the gradation value differences is equal to or larger than the first threshold Th1 continue by a number equal to or larger than the second threshold Th2 monotonously in the X direction or in a state where frames continuing in the X direction and frames continuing in the Y direction are mixed, the consecutive frames can be detected as the second defects.

Figure 5A:
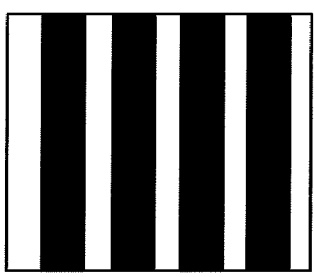
FIG. 5A is a plan view illustrating a normal reference image in the pattern inspection method according to the first embodiment.
Figure 5B:
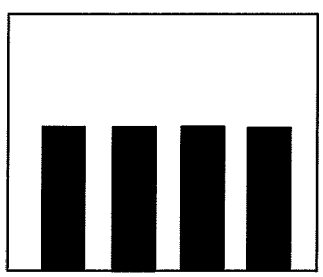
FIG. 5B is a plan view illustrating an example of an abnormality in the reference image.
Figure 5C:
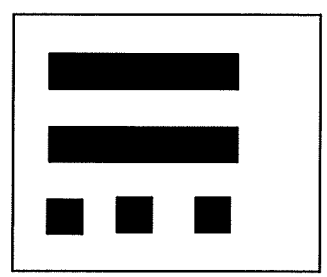
FIG. 5C is a plan view illustrating another example of the abnormality in the reference image.

FIG. 5A is a plan view illustrating a normal reference image in the pattern inspection method according to the first embodiment. FIG. 5B is a plan view illustrating an example of an abnormality in the reference image. FIG. 5C is a plan view illustrating another example of the abnormality in the reference image. When frames in which the gradation value differences between the optical image and the reference image are large are distributed consecutively (YES at Step S2), it can be assumed, for example, that there are missing portions in the pattern of the reference image as illustrated in FIG. 5B or that a reference image of a completely different pattern as illustrated in FIG. 5C is generated relative to the normal reference image as illustrated in FIG. 5A. In this case, the comparison circuit 25 determines corresponding frames as the second defects and performs an error stop of the first inspection.

On the other hand, as illustrated in FIG. 2, when frames in which the sum of the gradation value differences is equal to or larger than the first threshold have not been generated consecutively by the consecution number equal to or larger than the second threshold (NO at Step S2), the comparison circuit 25 performs the second inspection after completion of the first inspection on the entire inspection region 201 (Step S4).

As described above, according to the first embodiment, the second defects can be detected during progression of the first inspection and an error stop of the first inspection can be performed when the second defects are detected. Accordingly, the error stop based on the detection of the second defects can be performed quickly in the first inspection of detecting many defects. Furthermore, because the inspection is performed based on the consecution number of frames in which the sum of the gradation value differences is large, the second defects having a tendency that many defects are generated locally can be detected appropriately.

Modification

Figure 6:
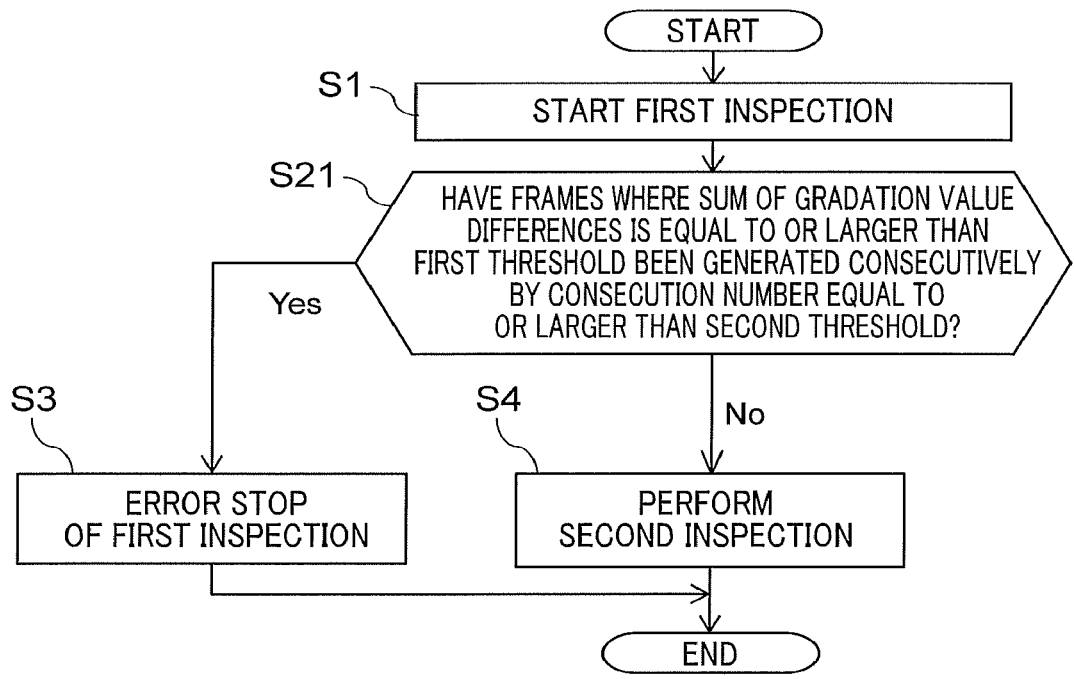
FIG. 6 is a flowchart illustrating a pattern inspection method according to the modification of the first embodiment.

A modification of the first embodiment in which the unit for the comparison of the sum of the gradation value differences to the first threshold in the detection of the second defects is a frame group is explained next. FIG. 6 is a flowchart illustrating a pattern inspection method according to the modification of the first embodiment.

In the example illustrated in FIG. 2, the unit for the comparison of the sum of the gradation value differences to the first threshold in the detection of the second defects is one frame and, when frames in which the sum of the gradation value differences is equal to or larger than the first threshold have been generated consecutively by a consecution number equal to or larger than the second threshold (YES at Step S2), the generated consecutive frames are detected as the second defects.

In contrast thereto, in this modification, the unit for the comparison of the sum of the gradation value differences to the first threshold in the detection of the second defects is a plurality of consecutive frames (hereinafter, also "frame group").

Specifically, the comparison circuit 25 compares the sum of the gradation value differences in pixels to the first threshold with respect to each of frame groups in the optical image of each of the stripes 202 in the detection of the second defects. The sum of the gradation value differences in pixels between the optical image and the reference image with respect to each of frame groups is, in other words, a value obtained by adding up differences of the gradation values in corresponding pixels between a frame group in the optical image and a frame group in the reference image corresponding the frame group in the optical image. When frame groups in which the sum of the gradation value differences is equal to or larger than the first threshold are distributed consecutively by a consecution number equal to or larger than a second threshold being a threshold for the consecution number of the frame groups, the comparison circuit 25 detects these frame groups distributed consecutively as the second defects.

That is, as illustrated in FIG. 6, the comparison circuit 25 determines whether frame groups in which the sum of the gradation value differences is equal to or larger than the first threshold have been generated consecutively by a consecution number equal to or larger than the second threshold (Step S21). When frame groups in which the sum of the gradation value differences is equal to or larger than the first threshold have been generated consecutively by a consecution number equal to or larger than the second threshold (YES at Step S21), the comparison circuit 25 detects the generated consecutive frame groups as the second defects and the error-stop determination circuit 26 performs an error stop of the first inspection in response to the fact that the second defects are detected (Step S3).

Figure 7:
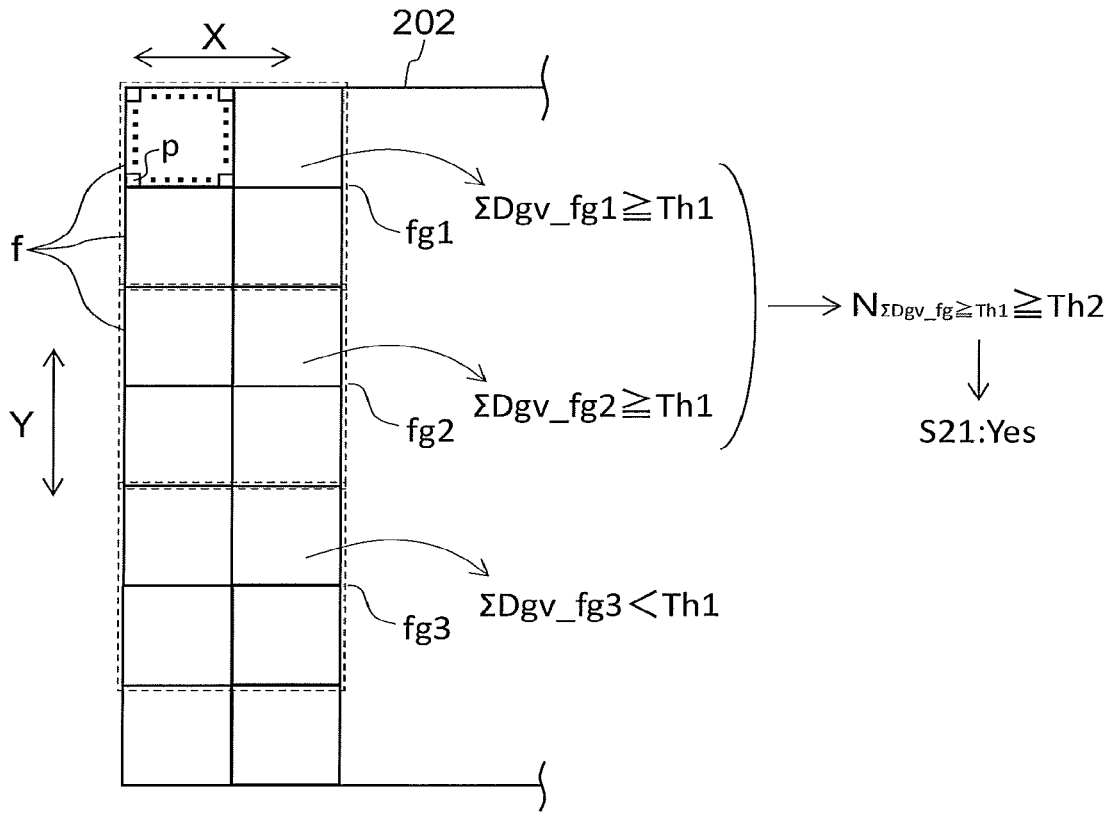
FIG. 7 is an explanatory diagram for explaining a detection process of the second defects in the pattern inspection method according to the modification of the first embodiment.

FIG. 7 is an explanatory diagram for explaining a detection process of the second defects in the pattern inspection method according to the modification of the first embodiment. First to third frame groups fg1 to fg3 arrayed in the Y direction corresponding to the width direction of the stripes 202 are illustrated in FIG. 7 as an optical image corresponding to one stripe 202.

Each of the first to third frame groups fg1 to fg3 is composed of four consecutive frames f including two frames in the X direction by two frames in the Y direction. In the example illustrated in FIG. 7, sums $\Sigma Dgv\_fg1$ and $\Sigma Dgv\_fg2$ of the gradation value differences between the optical image and the reference image in the first and second frame groups fg1 and fg2 are equal to or larger than the first threshold Th1. On the other hand, a sum $\Sigma Dgv\_fg3$ of the gradation value differences between the optical image and the reference image of the third frame group fg3 is smaller than the first threshold Th1.

In the example illustrated in FIG. 7, the second threshold Th2 for a consecution number $N_{\Sigma Dgv\_fg \geq Th1}$ of frame groups in which the sum of the gradation value differences is equal to or larger than the first threshold Th1 is set to "2". In this case, because the consecution number $N_{\Sigma Dgv\_fg \geq Th1}$ of the first and second frame groups fg1 and fg2 in which the sum of the gradation value differences is equal to or larger than the first threshold Th1 is "2", the consecution number $N_{\Sigma Dgv\_fg \geq Th1}$ is equal to or larger than the second threshold Th2 (YES at Step S21). Therefore, in the example illustrated in FIG. 7, the consecutive first and second frame groups fg1 and fg2 are detected as the second defects and an error stop of the first inspection is performed. In the example illustrated in FIG. 7, the frame groups fg1 and fg2 in which the sum of the gradation value differences is equal to or larger than the first threshold Th1 continue in the Y direction by a number equal to or larger than the second threshold Th2. Other than this case, for example, also in a case where frame groups in which the sum of the gradation value differences is equal to or larger than the first threshold Th1 continue by a number equal to or larger than the second threshold Th2 monotonously in the X direction or in a state where frame groups continuing in the X direction and frame groups continuing in the Y direction are mixed, the consecutive frame groups can be detected as the second defects.

Also in this modification, based on the consecution number of frame groups in which the sum of the graduation value differences is large, the second defects having a tendency that many defects are generated locally can be detected quickly to perform an error stop of the first inspection.

Second Embodiment

Figure 8:
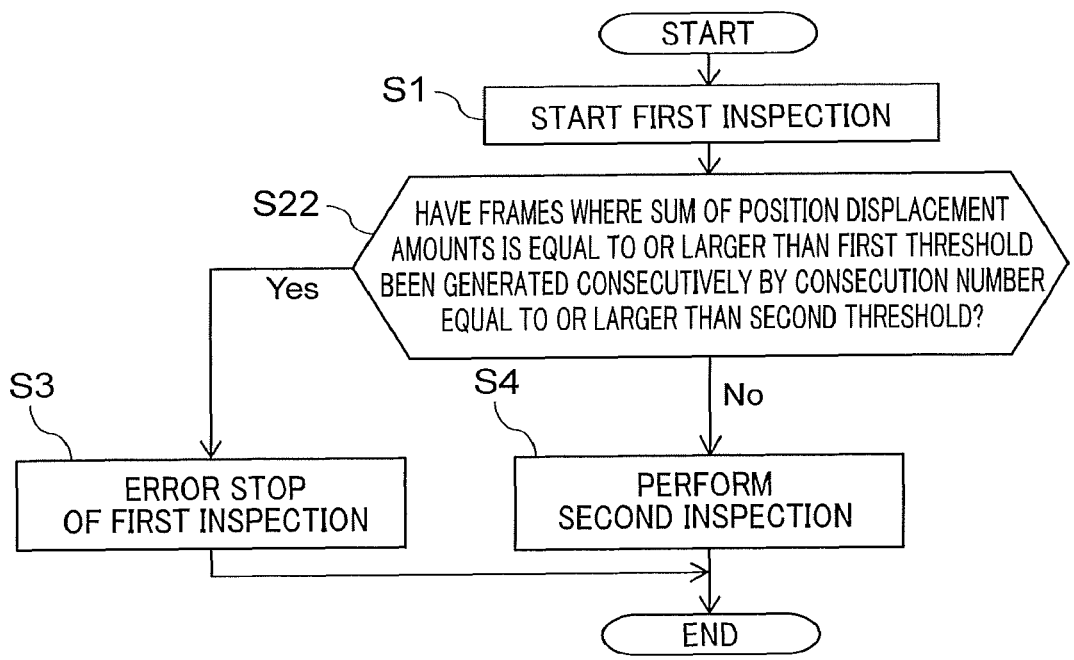
FIG. 8 is a flowchart illustrating a pattern inspection method according to the second embodiment.

A second embodiment in which the second defects are detected based on the sum of position displacement amounts is explained next. FIG. 8 is a flowchart illustrating a pattern inspection method according to the second embodiment.

In the first embodiment, the second defects are detected based on the first threshold for the sum of the gradation value differences and the second threshold for the consecution number of frames in which the sum of the gradation value differences is equal to or larger than the first threshold. In contrast thereto, the second defects are detected in the second embodiment based on a first threshold for the sum of position displacement amounts in pixels between the optical image and the reference image, and a second threshold for the consecution number of frames in which the sum of the position displacement amounts is equal to or larger than the first threshold.

Specifically, in the detection of the second defects, the comparison circuit 25 compares the sum of the position displacement amounts in pixels to the first threshold with respect to each frame in the optical image of each of the stripes 202. The sum of the position displacement amounts in pixels between the optical image and the reference image with respect to each frame is, in other words, a value obtained by adding up position displacement amounts in corresponding pixels between a frame in the optical image and a frame in the reference image corresponding to the frame in the optical image. When frames in which the sum of the position displacement amounts is equal to or larger than the first threshold are distributed consecutively by a consecution number equal to or larger than the second threshold being a threshold for the consecution number of the frames, the comparison circuit 25 detects the frames distributed consecutively as the second defects.

That is, as illustrated in FIG. 8, the comparison circuit 25 determines whether frames in which the sum of the position displacement amounts is equal to or larger than the first threshold have been generated consecutively by a consecution number equal to or larger than the second threshold (Step S22). When frames in which the sum of the position displacement amounts is equal to or larger than the first threshold have been generated consecutively by a consecution number equal to or larger than the second threshold (YES at Step S22), the comparison circuit 25 detects the generated consecutive frames as the second defects and the error-stop determination circuit 26 performs an error stop of the first inspection in response to the fact that the second defects are detected (Step S3).

Figure 9:
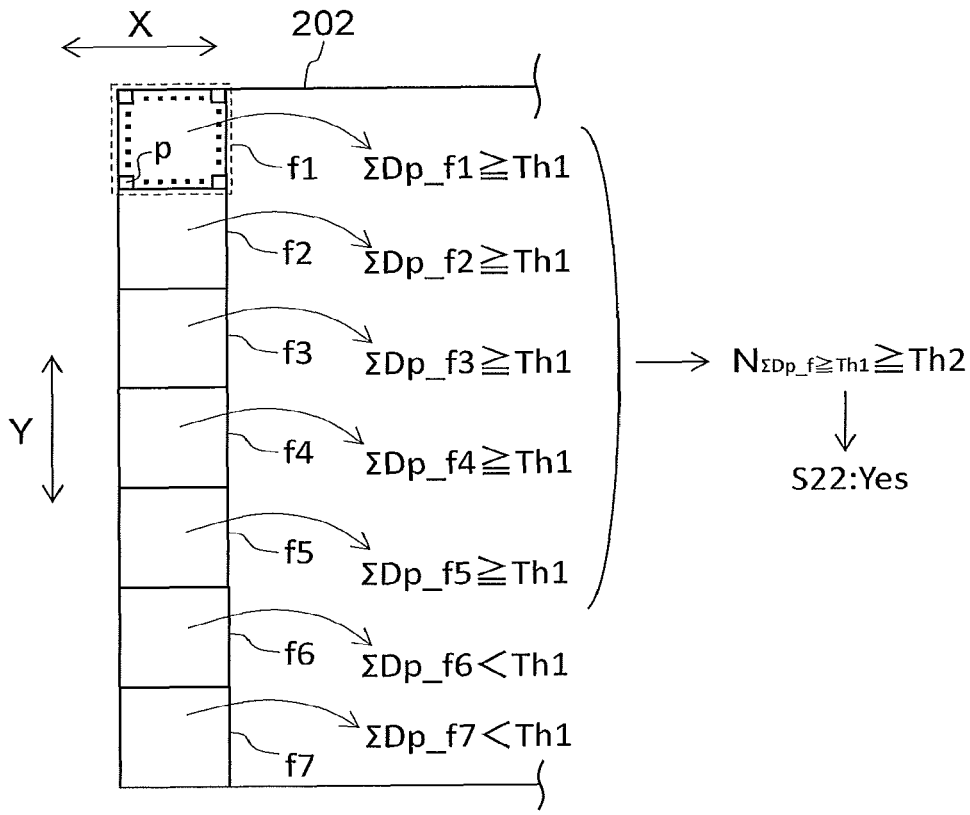
FIG. 9 is an explanatory diagram for explaining a detection process of the second defects in the pattern inspection method according to the second embodiment.

FIG. 9 is an explanatory diagram for explaining a detection process of the second defects in the pattern inspection method according to the second embodiment. First to seventh frames f1 to f7 arrayed in the Y direction corresponding to the width direction of the stripes 202 are illustrated in FIG. 9.

In the example illustrated in FIG. 9, sums $\Sigma Dp\_f1$ to $\Sigma Dp\_f5$ of position displacement amounts in the pattern between the optical image and the reference image of the first to fifth frames f1 to f5 are equal to or larger than the first threshold Th1. On the other hand, sums $\Sigma Dp\_f6$ and $\Sigma Dp\_f7$ of the position displacement amounts in the pattern between the optical image and the reference image of the sixth and seventh frames f6 and f7 are smaller than the first threshold Th1. For example, the position displacement amount can be obtained by fixing the reference image and calculating a movement amount at a time when the optical image is moved until corresponding pixels in the pattern of the optical image are superimposed on target pixels in the pattern of the reference image as the position displacement amount. The position displacement amount can be obtained, for example, using the number of pixels as a unit although not limited thereto. The sum of the position displacement amounts can be, for example, a value obtained by adding up the position displacement amounts of respective target pixels, which are calculated for all pixels in the pattern of the reference image included in the frame as the target pixels, although not limited thereto.

In the example illustrated in FIG. 9, a second threshold Th2 for a consecution number $N_{\Sigma Dp\_f \geq Th1}$ of frames in which the sum of the position displacement amounts is equal to or larger than the first threshold Th1 is set to "4". In this case, because the consecution number $N_{\Sigma Dp\_f \geq Th1}$ of the first to fifth frames f1 to f5 in which the sum of the position displacement amounts is equal to or larger than the first threshold Th1 is "5", the consecution number $N_{\Sigma Dp\_f \geq Th1}$ is equal to or larger than the second threshold Th2 (YES at Step S22). Therefore, in the example illustrated in FIG. 9, the consecutive first to fifth frames f1 to f5 are detected as the second defects and an error stop of the first inspection is performed. In the example illustrated in FIG. 9, the frames f1 to f5 in which the sum of the position displacement amounts is equal to or larger than the first threshold Th1 continue in the Y direction by the number equal to or larger than the second threshold Th2. Other than this case, for example, also in a case where frames in which the sum of the position displacement amounts is equal to or larger than the first threshold Th1 continue by a number equal to or larger than the second threshold Th2 monotonously in the X direction or in a state where frames continuing in the X direction and frames continuing in the Y direction are mixed, the consecutive frames can be detected as the second defects.

Also in the second embodiment, based on the consecution number of frames in which the sum of the position displacement amounts is large, the second defects having a tendency that many defects are generated locally can be detected quickly to perform an error stop of the first inspection.

Modification

Figure 10:
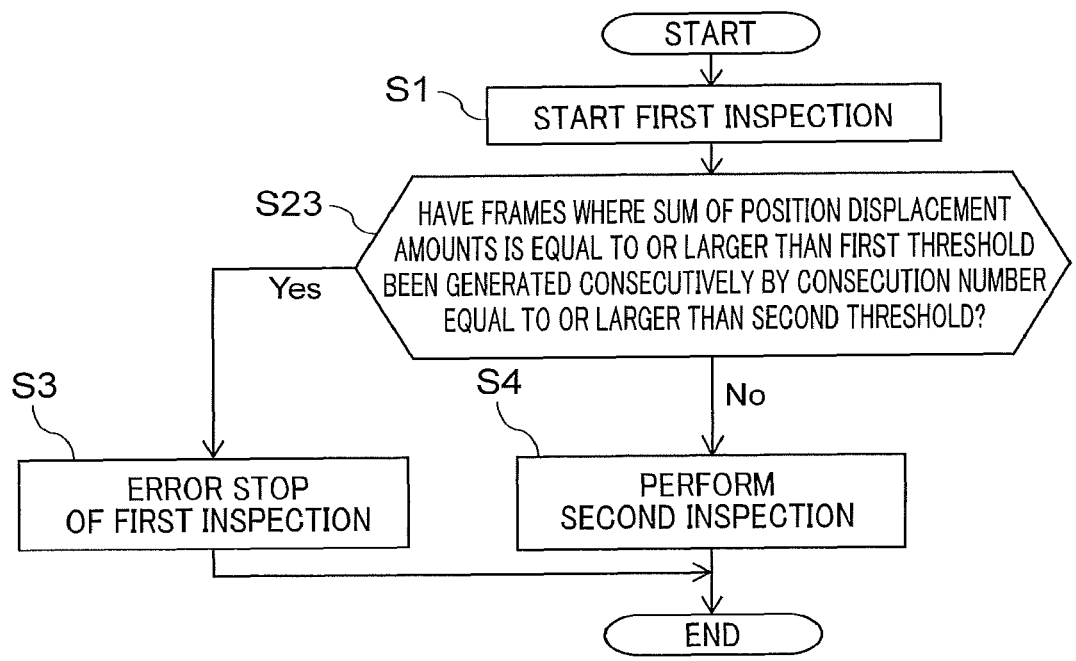
FIG. 10 is a flowchart illustrating a pattern inspection method according to the modification of the second embodiment.

A modification of the second embodiment in which the unit for the comparison of the sum of the position displacement amounts to the first threshold in the detection of the second defects is a frame group is explained next. FIG. 10 is a flowchart illustrating a pattern inspection method according to the modification of the second embodiment.

In the example illustrated in FIG. 8, the unit for the comparison of the sum of the position displacement amounts to the first threshold in the detection of the second defects is one frame and, when frames in which the sum of the position displacement amounts is equal to or larger than the first threshold have been generated consecutively by a consecution number equal to or larger than the second threshold (YES at Step S22), the generated consecutive frames are detected as the second defects.

In contrast thereto, in this modification, the unit for the comparison of the sum of the position displacement amounts to the first threshold in the detection of the second defects is a plurality of consecutive frames (hereinafter, also "frame group").

Specifically, the comparison circuit 25 compares the sum of the position displacement amounts in pixels to the first threshold with respect to each of frame groups in the optical image of each of the stripes 202 in the detection of the second defects. The sum of the position displacement amounts in the pixels between the optical image and the reference image with respect to each of frame groups is, in other words, a value obtained by adding up position displacement amounts in corresponding pixels between a frame group in the optical image and a frame group in the reference image corresponding to the frame group in the optical image. When frame groups in which the sum of the position displacement amounts is equal to or larger than the first threshold are distributed consecutively by a consecution number equal to or larger than a second threshold being a threshold for the consecution number of the frame groups, the comparison circuit 25 detects the frame groups distributed consecutively as the second defects.

That is, as illustrated in FIG. 10, the comparison circuit 25 determines whether frame groups in which the sum of the position displacement amounts is equal to or larger than the first threshold have been generated consecutively by a consecution number equal to or larger than the second threshold (Step S23). When frame groups in which the sum of the position displacement amounts is equal to or larger than the first threshold have been generated consecutively by a consecution number equal to or larger than the second threshold (YES at Step 23), the comparison circuit 25 detects the generated consecutive frame groups as the second defects and the error-stop determination circuit 26 performs an error stop of the first inspection in response to the fact that the second defects are detected (Step S3).

Figure 11:
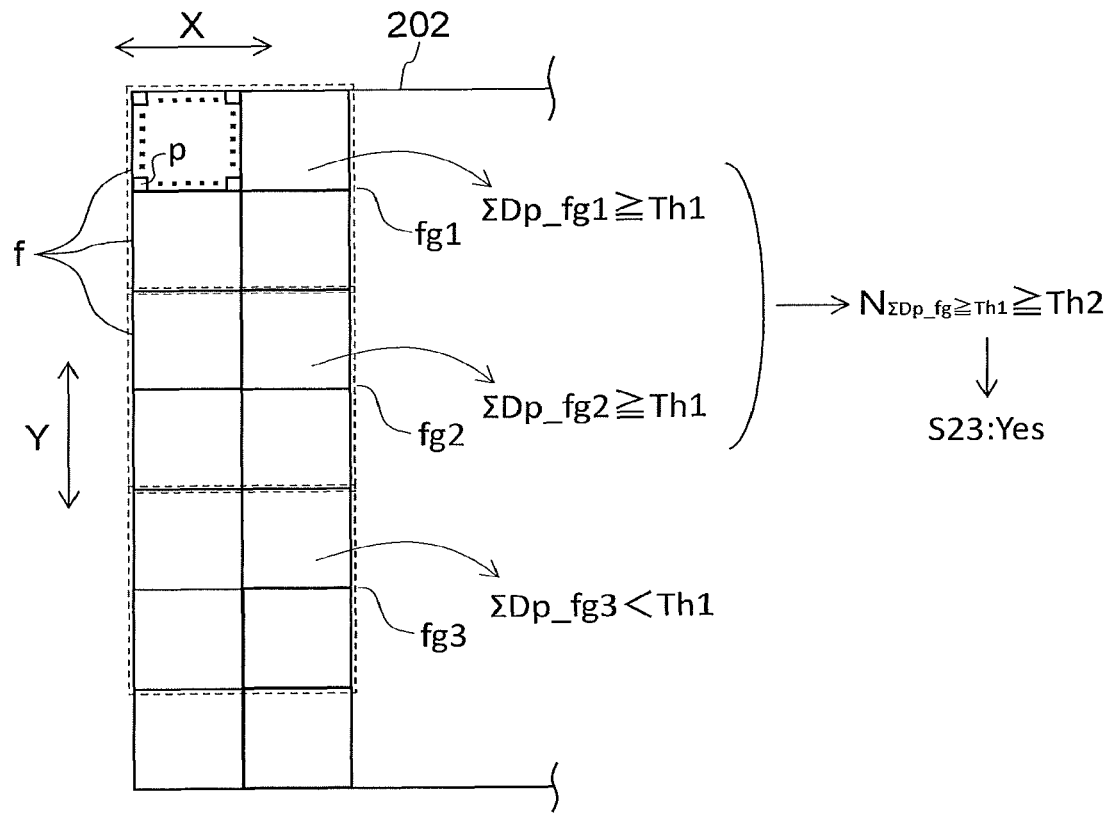
FIG. 11 is an explanatory diagram for explaining a detection process of the second defects in the pattern inspection method according to the modification of the second embodiment.

FIG. 11 is an explanatory diagram for explaining a detection process of the second defects in the pattern inspection method according to the modification of the second embodiment. First to third frame groups fg1 to fg3 arrayed in the Y direction corresponding to the width direction of the stripes 202 are illustrated in FIG. 11.

Each of the first to third frame groups fg1 to fg3 is composed of four consecutive frames f including two frames in the X direction by two frames in the Y direction. In the example illustrated in FIG. 11, sums ΣDp_fg1 and ΣDp_fg2 of the position displacement amounts between the optical image and the reference image in the first and second frame groups fg1 and fg2 are equal to or larger than the first threshold Th1. On the other hand, a sum ΣDp_fg3 of the position displacement amounts between the optical image and the reference image in the third frame group fg3 is smaller than the first threshold Th1.

In the example illustrated in FIG. 11, the second threshold Th2 for a consecution number $N_{\Sigma Dp\_fg \geq Th1}$ of frame groups in which the sum of the position displacement amounts is equal to or larger than the first threshold Th1 is set to "2". In this case, because the consecution number $N_{\Sigma Dp\_fg \geq Th1}$ of the first and second frame groups fg1 and fg2 in which the sum of the position displacement amounts is equal to or larger than the first threshold Th1 is "2", the consecution number $N_{\Sigma Dp\_fg \geq Th1}$ is equal to or larger than the second threshold (YES at Step S23). Therefore, in the example illustrated in FIG. 11, the consecutive first and second frame groups fg1 and fg2 are detected as the second defects and an error stop of the first inspection is performed. In the example illustrated in FIG. 11, the frame groups fg1 and fg2 in which the sum of the position displacement amounts is equal to or larger than the first threshold Th1 continue in the Y direction by the number equal to or larger than the second threshold Th2. Other than this case, for example, also in a case where frame groups in which the sum of the position displacement amounts is equal to or larger than the first threshold Th1 continue by a number equal to or larger than the second threshold Th2 monotonously in the X direction or in a state where frame groups continuing in the X direction and frame groups continuing in the Y direction are mixed, the consecutive frame groups can be detected as the second defects.

Also in this modification, based on the consecution number of frame groups in which the sum of the position displacement amounts is large, the second defects having a tendency that many defects are generated locally can be detected quickly to perform an error stop of the first inspection.

Third Embodiment

Figure 12:
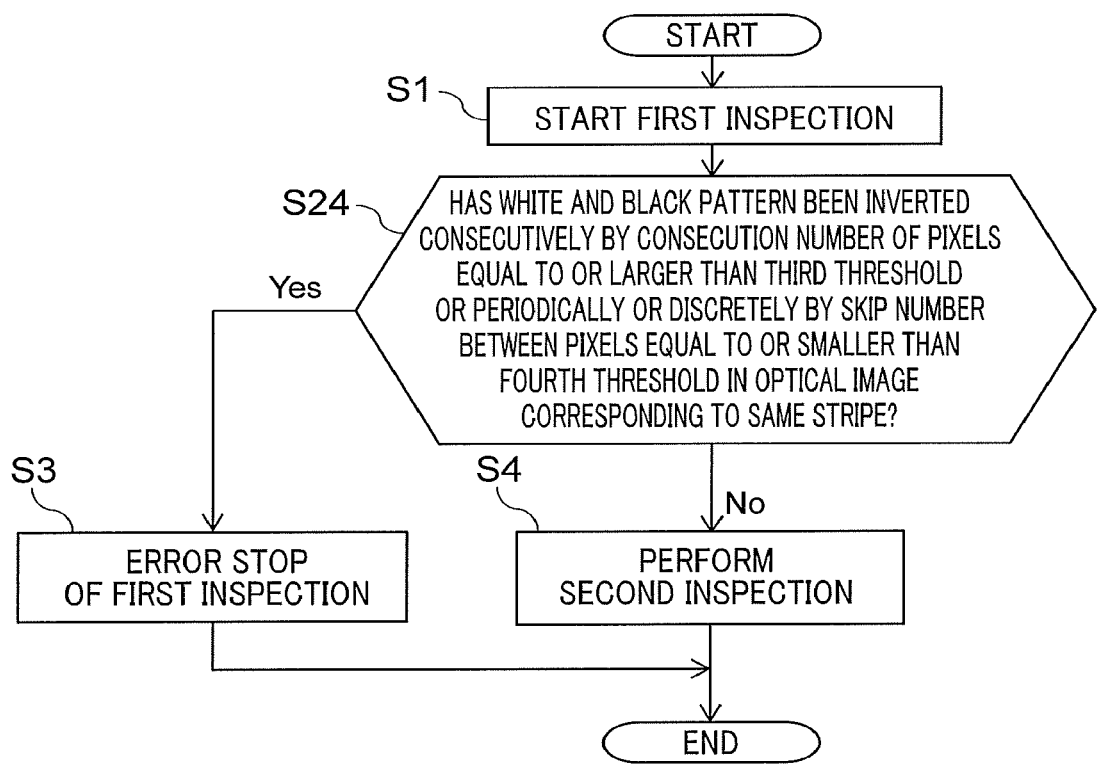
FIG. 12 is a flowchart illustrating a pattern inspection method according to the third embodiment.

A third embodiment in which the second defects are detected based on an inversion state of a white and black pattern between the optical image and the reference image is explained next. FIG. 12 is a flowchart illustrating a pattern inspection method according to the third embodiment.

In the third embodiment, when pixels in which white and black are inverted between the optical image and the reference image are distributed consecutively in the optical image of each of the stripes 202 by a consecution number equal to or larger than a third threshold being a threshold for the consecution number of the pixels, the comparison circuit 25 detects these pixels distributed consecutively as the second defects.

In the third embodiment, when pixels in which white and black are inverted between the optical image and the reference image are distributed periodically or discretely in the optical image of each of the stripes 202 with a skip number equal to or smaller than a fourth threshold being a threshold for the number of skipped pixels, the comparison circuit 25 detects the pixels distributed periodically or discretely as the second defects. The term "periodically" means, for example, that the number of skipped pixels between pixels in which white and black are inverted is constant. The term "discretely" means, for example, that the number of skipped pixels between pixels in which white and black are inverted is irregular.

That is, in the third embodiment, the comparison circuit 25 determines whether a white and black pattern has been inverted consecutively by a consecution number equal to or larger than the third threshold or inverted periodically or discretely with a skip number equal to or smaller than the fourth threshold in an optical image corresponding to a same strip 202 as illustrated in FIG. 12 (Step S24). When the white and black pattern has been inverted in pixels consecutively by a consecution number equal to or larger than the third threshold or inverted periodically or discretely with a skip number equal to or smaller than the fourth threshold (YES at Step S24), the comparison circuit 25 detects the pixels in which the white and black pattern has been inverted as the second defects and the error-stop determination circuit 26 performs an error stop of the first inspection (Step S3).

Figure 13A:
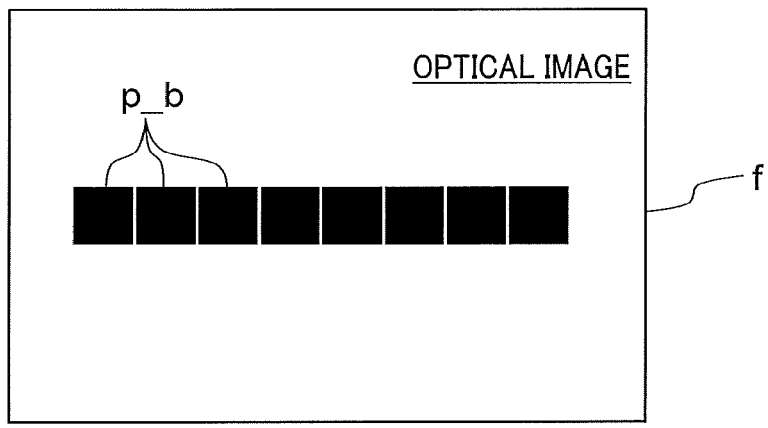
FIG. 13A is a plan view illustrating an example of the optical image in the pattern inspection method according to the third embodiment.
Figure 13B:
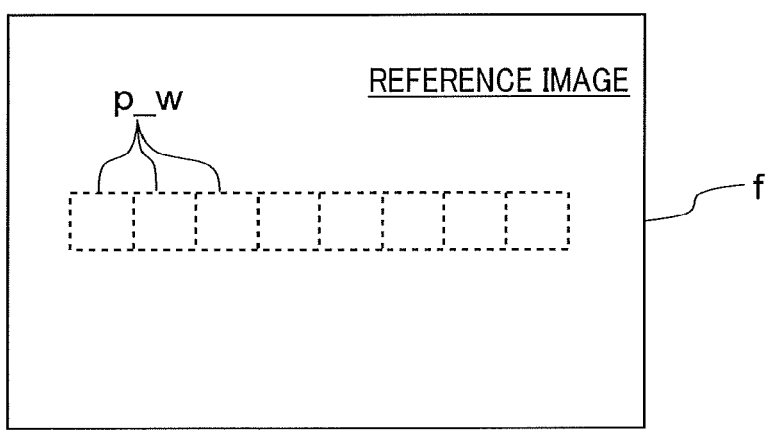
FIG. 13B is a plan view illustrating an example of the reference image.

FIG. 13A is a plan view illustrating an example of the optical image in the pattern inspection method according to the third embodiment. FIG. 13B is a plan view illustrating an example of the reference image. In the example illustrated in FIG. 13A, eight black pixels P_b are distributed consecutively in a frame f of the optical image. In the example illustrated in FIG. 13B, eight consecutive pixels corresponding to the black pixels P_b in FIG. 13A are all inverted to white pixels P_w in a frame f of the reference image corresponding to the frame f of the optical image in FIG. 13A. In the examples illustrated in FIGS. 13A and 13B, the third threshold for the consecution number of inverted pixels in the white and black pattern is set to "5". In this case, because the consecution number of inverted pixels in the white and black pattern of the optical image illustrated in FIG. 13A with respect to the reference image illustrated in FIG. 13B is "8", the consecution number of inverted pixels is equal to or larger than the third threshold. Therefore, in the examples illustrated in FIGS. 13A and 13B, the consecutive eight black pixels P_b are detected as the second defects and an error stop of the first inspection is performed.

Figure 14A:
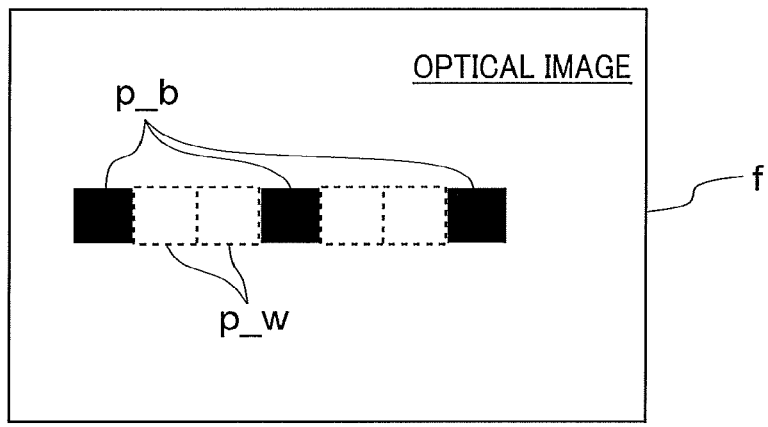
FIG. 14A is a plan view illustrating another example of the optical image in the pattern inspection method according to the third embodiment.
Figure 14B:
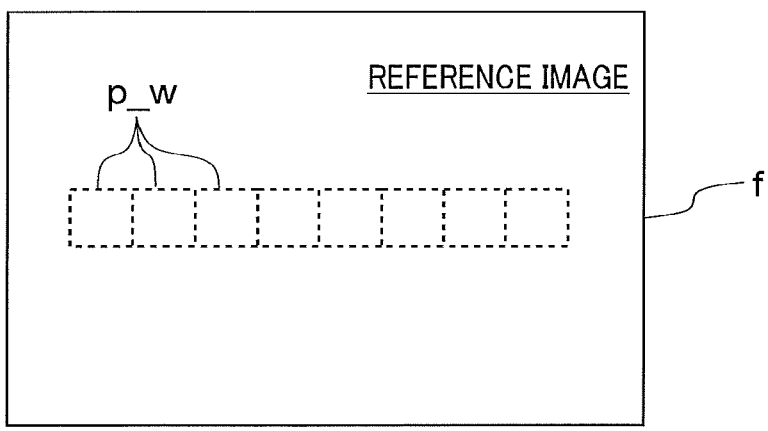
FIG. 14B is a plan view illustrating another example of the reference image.

FIG. 14A is a plan view illustrating another example of the optical image in the pattern inspection method according to the third embodiment. FIG. 14B is a plan view illustrating another example of the reference image. In the example illustrated in FIG. 14A, black pixels P_b are distributed periodically with a skip number of two in a frame f of the optical image. In the example illustrated in FIG. 14B, pixels corresponding to the black pixels P_b in FIG. 14A are all inverted to white pixels P_w in a frame f of the reference image corresponding to the frame f of the optical image in FIG. 14A. In the examples illustrated in FIG. 14A and 14B, the fourth threshold for the skip number between inverted pixels in the white and black pattern is set to "4". In this case, because the skip number between the inverted pixels in the white and black pattern of the optical image in FIG. 14A with respect to the reference image in FIG. 14B is "2", the skip number between the inverted pixels is equal to or smaller than the fourth threshold. Therefore, in the examples illustrated in FIGS. 14A and 14B, the black pixels P_b distributed with the skip number of two are detected as the second defects and an error stop of the first inspection is performed.

The comparison circuit 25 can use a frame, instead of the pixel, as the unit for the comparison to the third threshold in the detection of the second defects. That is, when frames in which white and black are inverted between the optical image and the reference image are distributed consecutively by a consecution number equal to or larger than the third threshold being a threshold for the consecution number of the frames in the optical image of each of the stripes 202, the comparison circuit 25 can detect the frames distributed consecutively as the second defects.

Furthermore, the comparison circuit 25 can use a frame, instead of the pixel, as the unit for the comparison to the fourth threshold in the detection of the second defects. That is, when frames in which white and black are inverted between the optical image and the reference image are distributed periodically or discretely by a skip number equal to or smaller than the fourth threshold being a threshold for the skip number between the frames in the optical image of each of the stripes 202, the comparison circuit 25 can detect the frames distributed periodically or discretely as the second defects.

Also in the third embodiment, based on the consecution number of pixels in which the white and black pattern is inverted, the second defects having a tendency that many defects are generated locally can be detected quickly to perform an error stop of the first inspection.

Fourth Embodiment

Figures 15, 16:
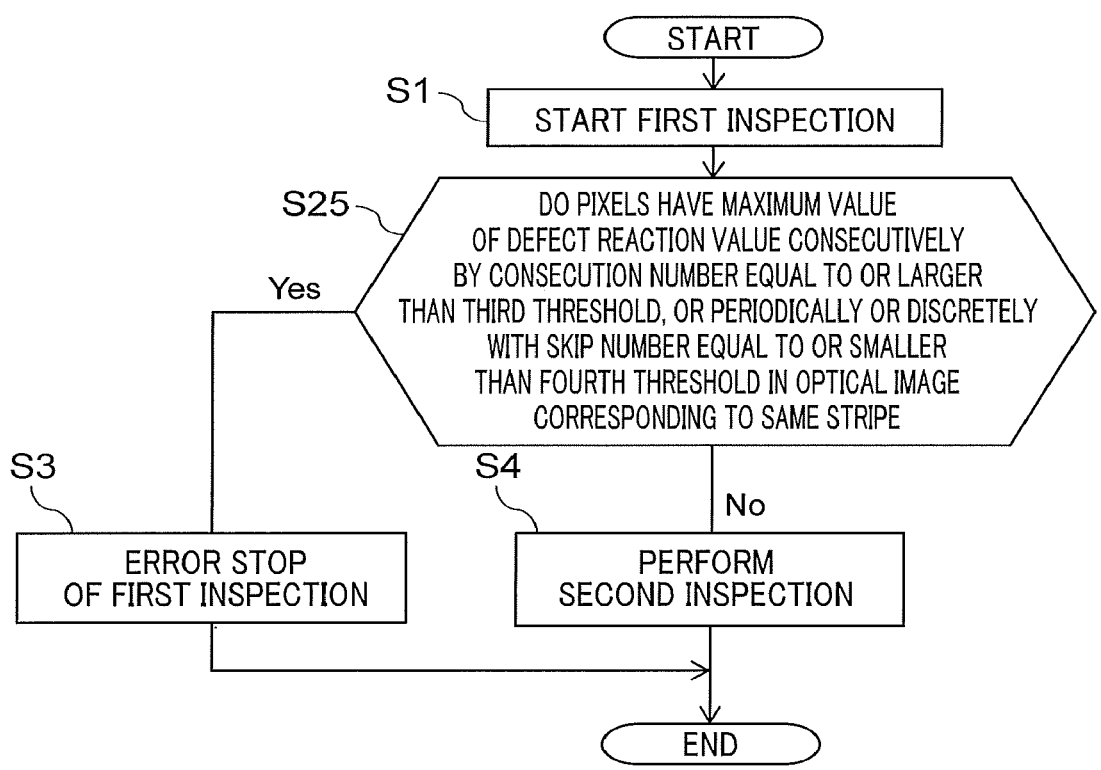
FIG. 15 is a flowchart illustrating a pattern inspection method according to the fourth embodiment.
FIG. 16 is a plan view illustrating an example of the defect reaction values in the pattern inspection method according to the fourth embodiment.

A fourth embodiment in which the second defects are detected based on a defect reaction value is explained next. FIG. 15 is a flowchart illustrating a pattern inspection method according to the fourth embodiment.

In the fourth embodiment, when pixels in which a reaction value (hereinafter, also "defect reaction value") for defect determination corresponding to a difference between the optical image and the reference image has a maximum value are distributed consecutively by a consecution number equal to or larger than the third threshold being a threshold for the consecution number of the pixels in the optical image of each of the stripes 202, the comparison circuit 25 detects these pixels distributed consecutively as the second defects. The defect reaction value is a value obtained by converting the difference between the optical image and the reference image to be used for determination as to whether there are defects. For example, the defect reaction value has 256 levels obtained by converting the gradation value difference or the position displacement amount in the corresponding pixels of the pattern between the optical image and the reference image, that is, is 0 to 255.

In the fourth embodiment, when pixels in which the defect reaction value has a maximum value are distributed periodically or discretely by a skip number equal to or larger than the fourth threshold being a threshold for the skip number between the pixels in the optical image of each of the stripes 202, the comparison circuit 25 detects the pixels distributed periodically or discretely as the second defects.

That is, as illustrated in FIG. 15, the comparison circuit 25 determines whether pixels have a maximum value of the defect reaction value consecutively by a consecution number equal to or larger than the third threshold, or periodically or discretely with a skip number equal to or smaller than the fourth threshold in the optical image corresponding to a same stripe (Step S25). When pixels have a maximum value of the defect reaction value consecutively by a consecution number equal to or larger than the third threshold, or periodically or discretely with a skip number equal to or smaller than the fourth threshold (YES at Step S25), the comparison circuit 25 detects the pixels having a maximum value of the defect reaction value as the second defects and the error-stop determination circuit 26 performs an error stop of the first inspection (Step S3).

FIG. 16 is a plan view illustrating an example of the defect reaction values in the pattern inspection method according to the fourth embodiment. In the example illustrated in FIG. 16, eight pixels p having the maximum value 255 of the defect reaction value continue in an optical image. In the example illustrated in FIG. 16, the third threshold for the consecution number of pixels having the maximum value of the defect reaction value is set to "5". In this case, because the consecution number of the pixels p having the maximum value of the defect reaction value is "8", the consecution number is equal to or larger than the third threshold. Therefore, in the example illustrated in FIG. 16, the consecutive eight pixels p are detected as the second defects and an error stop of the first inspection is performed.

FIG. 17 is a plan view illustrating another example of the defect reaction values in the pattern inspection method according to the fourth embodiment. In the example illustrated in FIG. 17, pixels p having the maximum value 255 of the defect reaction value are distributed periodically with a skip number of two in an optical image. In the example illustrated in FIG. 17, the fourth threshold for the skip number between pixels having the maximum value of the defect reaction value is set to "4". In this case, because the skip number between the pixels p having the maximum value of the defect reaction value is "2", the skip number is equal to or smaller than the fourth threshold. Therefore, in the example illustrated in FIG. 17, the pixels p having the maximum value of the defect reaction value and being distributed by the skip number of two are detected as the second defects and an error stop of the first inspection is performed.

The comparison circuit 25 can use a frame, instead of the pixel, as the unit for the comparison to the third threshold in the detection of the second defects. That is, when frames having the maximum value of the defect reaction value are distributed consecutively by a consecution number equal to or larger than the third threshold being a threshold for the consecution number of the frames in the optical image of each of the stripes 202, the comparison circuit 25 can detect the frames distributed consecutively as the second defects.

The defect reaction value of a frame can be an average value of the defect reaction values of respective pixels included in the frame although not limited thereto.

Furthermore, the comparison circuit 25 can use a frame, instead of the pixel, as the unit for the comparison to the fourth threshold in the detection of the second defects. That is, when frames having the maximum value of the defect reaction value are distributed periodically or discretely with a skip number equal to or smaller than the fourth threshold being a threshold for the skip number between the frames in the optical image of each of the stripes 202, the comparison circuit 25 can detect the frames distributed periodically or discretely as the second defects.

Also in the fourth embodiment, based on the consecution number of pixels in which the defect reaction value has the maximum value, the second defects having a tendency that many defects are generated locally can be detected quickly to perform an error stop of the first inspection.

The embodiments described above can be also applied to an inspection accompanied by detection of many defects and different from the defect-transferability consideration inspection.

At least a part of the pattern inspection system 1 can be constituted by hardware and can be constituted by software. When the pattern inspection system 1 is constituted by software, it is possible to configure that a program for realizing at least a part of the functions of the pattern inspection system 1 is stored in a recording medium such as a flexible disk and a CD-ROM and then read in a computer to be executed. The recording medium is not limited to a detachable medium such as a magnetic disk and an optical disk, but can be a fixed recording medium such as a hard disk device and a memory.

The embodiments described above have been presented by way of example only and are not intended to limit the scope of the invention. The embodiments can be implemented in a variety of other forms, and various omissions, substitutions and changes can be made without departing from the spirit of the invention. The embodiments and modifications thereof are included in the scope of invention described in the claims and their equivalents as well as the scope and the spirit of the invention.

The invention claimed is:

1. An inspection method for inspecting defects in a pattern located on a sample using an inspection system inspecting the defects in the pattern, the inspection method comprising:
scanning an inspection region of the sample with light;
acquiring an optical image formed of the scanning light according to progression of scanning with the light;
creating a reference image as a reference for the acquired optical image according to progression of acquisition of the optical image;
comparing the acquired optical image to the reference image for the optical image to detect first defects in the pattern according to progression of the acquisition of the optical image;
detecting second defects in the pattern caused by an erroneous operation of the inspection system based on a distribution of differences between the acquired optical image and the reference image during progression of detection of the first defect; and
stopping the inspection when the second defects are detected.

2. The method of claim 1, wherein
the detection of the second defects comprises:
comparing a difference between the optical image and the reference image to a first threshold being a threshold for the difference in each unit of one frame or plural consecutive frames in the optical image; and
when the units of one frame or plural frames in which the difference is equal to or larger than the first threshold are distributed consecutively by a consecution number equal to or larger than a second threshold being a threshold for a consecution number of the units of one frame or plural frames, detecting the units of one frame or plural frames distributed consecutively as the second defects.

3. The method of claim 2, wherein
the difference between the optical image and the reference image is at least either a sum of gradation value differences or a sum of position displacement amounts between the optical image and the reference image in respective pixels, and
the detection of the second defects comprises
when units of one frame or plural frames in which the sum of at least either the gradation value differences or the position displacement amounts between the optical image and the reference image is equal to or larger than the first threshold are distributed consecutively by a consecution number equal to or larger than the second threshold, detecting the units of one frame or plural frames distributed consecutively as the second defects.

4. The method of claim 3, wherein
the detection of the second defects comprises:
when pixels or frames in which white and black are inverted between the optical image and the reference image or pixels or frames in which a reaction value for defect determination corresponding to a difference between the optical image and the reference image has a maximum value are distributed consecutively in the optical image by a consecution number equal to or larger than a third threshold being a threshold for a consecution number of the pixels or frames, detecting the pixels or frames distributed consecutively as the second defects, and/or
when pixels or frames in which white and black are inverted between the optical image and the reference image or pixels or frames in which the reaction value has a maximum value are distributed periodically or discretely in the optical image with a skip number between pixels or frames equal to or smaller than a fourth threshold being a threshold for a skip number between the pixels and frames, detecting the pixels or frames distributed periodically or discretely as the second defects.

5. The method of claim 2, wherein
the detection of the second defects comprises:
when pixels or frames in which white and black are inverted between the optical image and the reference image or pixels or frames in which a reaction value for defect determination corresponding to a difference between the optical image and the reference image has a maximum value are distributed consecutively in the optical image by a consecution number equal to or larger than a third threshold being a threshold for a consecution number of the pixels or frames, detecting the pixels or frames distributed consecutively as the second defects, and/or
when pixels or frames in which white and black are inverted between the optical image and the reference image or pixels or frames in which the reaction value has a maximum value are distributed periodically or discretely in the optical image with a skip number between pixels or frames equal to or smaller than a fourth threshold being a threshold for a skip number between the pixels and frames, detecting the pixels or frames distributed periodically or discretely as the second defects.

6. The method of claim 1, wherein
the detection of the second defects comprises:
when pixels or frames in which white and black are inverted between the optical image and the reference image or pixels or frames in which a reaction value for defect determination corresponding to a difference between the optical image and the reference image has a maximum value are distributed consecutively in the optical image by a consecution number equal to or larger than a third threshold being a threshold for a consecution number of the pixels or frames, detecting the pixels or frames distributed consecutively as the second defects, and/or when pixels or frames in which white and black are inverted between the optical image and the reference image or pixels or frames in which the reaction value has a maximum value are distributed periodically or discretely in the optical image with a skip number between pixels or frames equal to or smaller than a fourth threshold being a threshold for a skip number between the pixels and frames, detecting the pixels or frames distributed periodically or discretely as the second defects.

7. An inspection system inspecting defects in a pattern located on a sample, the inspection system comprising:

a light scanner scanning an inspection region of the sample with light;

an optical-image acquiring part acquiring an optical image formed of the scanning light according to progression of scanning by the light scanner;

a reference image creator creating a reference image as a reference for the acquired optical image according to progression of acquisition of the optical image by the optical-image acquiring part;

a first detector detecting first defects in the pattern by comparing the acquired optical image to the reference image created for the optical image by the reference image creator according to progression of the acquisition of the optical image by the optical-image acquiring part;

a second detector detecting second defects in the pattern caused by an erroneous operation of the inspection system based on a distribution of differences between the acquired optical image and the reference image during progression of detection of the first defects; and an inspection stopper stopping the inspection when the second defects are detected.

* * * * *